(12) United States Patent
Abernathy

(10) Patent No.: US 6,414,519 B1
(45) Date of Patent: Jul. 2, 2002

(54) EQUAL DELAY CURRENT-MODE LOGIC CIRCUIT

(75) Inventor: Brian Lee Abernathy, Poway, CA (US)

(73) Assignee: Applied Micro Circuits Corporation, San Diego, CA (US)

(*) Notice: Subject to any disclaimer, the term of this patent is extended or adjusted under 35 U.S.C. 154(b) by 0 days.

(21) Appl. No.: 09/662,443

(22) Filed: Sep. 15, 2000

(51) Int. Cl.[7] ............................................. H03K 19/20
(52) U.S. Cl. ...................... 326/127; 326/115; 327/355; 327/356; 327/359
(58) Field of Search ........................... 329/89, 115, 104, 329/124, 127, 83, 86, 85, 52, 55; 327/355, 356, 359

(56) References Cited

U.S. PATENT DOCUMENTS

| | | | |
|---|---|---|---|
| 5,583,456 A | | 12/1996 | Kimura ....................... 326/115 |
| 5,959,491 A | * | 9/1999 | Kang .......................... 327/359 |
| 6,040,731 A | * | 3/2000 | Chen et al. .................. 327/359 |
| 6,100,760 A | * | 8/2000 | Maruyama et al. ......... 330/254 |
| 6,137,309 A | * | 10/2000 | Couteaux et al. ............. 326/55 |
| 6,194,917 B1 | * | 2/2001 | Deng .......................... 327/12 |

OTHER PUBLICATIONS

Buchwald, A.W., et al., "A 6–GHz Integrated Phase–Locked Loop Using AlGaAs/GaAs Heterojunction Bipolar Transistors", IEEE Journal of Solid–State Circuits, Dec. 1992, pp. 1752–1762, vol. 27, No. 12.

* cited by examiner

Primary Examiner—Michael Tokar
Assistant Examiner—Vibol Tan
(74) Attorney, Agent, or Firm—Gary Cary Ware & Freidenrich

(57) ABSTRACT

A differential signal current-mode logic (CML) circuit is provided which provides an equal delay output. Convention differential logic CML circuits have upper stage and lower stage transistors pairs. Input signals that are provided to the lower stage are necessarily delayed with respect to inputs provided to the upper stage. The present invention provides parallel upper stage sections so that each input signal is translated to the output through the same number of transistors. Thus, the delay associated with each input signal is made equal. Specific examples of exclusive OR, OR, and AND circuits are provided.

23 Claims, 7 Drawing Sheets

EQUAL DELAY CURRENT-MODE LOGIC CIRCUIT

BACKGROUND OF THE INVENTION

1. Field of the Invention

This invention relates generally to transistorized logic circuitry and, more particularly, to a circuit for eliminating delays in digital logical circuitry using differential signals.

2. Description of the Related Art

Current-mode logic (CML) gates operating with differential mode signals suffer from an inherent signal delay problem. Upper and lower transistors and transistor pairs are cascoded, with a first differential input logic signal driving the upper level transistors and a second differential input logic signal driving the lower level transistors. The circuit output is connected to the collectors of the upper level transistors. Therefore, a change in the first logic signal is seen at the output with a delay associated with the action of the upper level transistors. Changes in the second input logic signal, however, involve the delays associated with both the upper and lower level transistors.

FIG. 1 is a schematic diagram of a conventional differential signal AND circuit (prior art). The circuit 10 performs an AND logical operation in response to the two input signals A and B. Since A and B are differential signals, they have N (first) and P (second) polarities. Thus, when AP is high, AN is low. Likewise, when BP is high, BN is low. The output of the logical operation is provided as a differential signal CP/CN. As mentioned above, changes in the A differential signals appear at the output with a delay associated with the upper level transistors 12 and 14. However, changes in the BP signal appear at the output with a delay associated with transistors 12, 14, and 16. Since the AND logical operation depends upon combinations of the A and B signals, the output signals are necessarily effected by the delay in the BP signal. These delays can add jitter and distortion to the output signal, and at high speeds of operations may even cause logic errors. Delays also exist in exclusive OR and OR circuitry using differential signals, since the circuit designs are very similar to the AND circuit design of FIG. 1.

It would be advantageous if differential logic circuitry could be designed to operate with minimum delays.

It would be advantageous if differential logic circuitry could be designed to equalize the delays associated with each input signal.

It would be advantageous if differential logic circuitry could be designed to have only a one transistor delay.

SUMMARY OF THE INVENTION

Accordingly, in an integrated circuit current-mode logic circuit, a method is provided for supplying a differential output signal with equal delays, the method comprises: accepting a first differential signal and an offset first differential signal with a voltage level offset; accepting a second differential signal and an offset second differential signal with a voltage level offset; performing a first logical operation using the first differential signal and the offset second differential signal; supplying a first operation differential signal product having a first delay associated with the first differential signal and a second delay, greater than the first delay, associated with the offset second differential signal; performing the first logical operation using the second differential signal and the offset first differential signal; supplying a first operation differential signal product having a first delay associated with the second differential signal and a second delay, greater than the first delay, associated with the offset first differential signal; and, combining the supplied first operation differential signal products to supply a combined first operation differential signal product having a first delay.

Also provided is an integrated circuit, CML circuit for supplying a differential output signal with equal delays, the circuit comprises a first differential cascode section having an upper transistor stage to accept a first differential input signal and a lower transistor stage to accept an offset second differential input. A second differential cascode section has an upper transistor stage to accept a second differential input signal and a lower transistor stage to accept an offset first differential input. The offset signals are one diode drop lower in voltage.

The first and second cascode sections are connected to supply a differential output signal having equal delays in response to the first differential input signal, the second differential input signal, the first offset differential input signal, and the second offset differential signal. Specific examples are provided of exclusive OR, OR, and AND circuits. However, the same equal delay principles can be applied to any other logical operation process, such as NAND and NOR logic circuits.

DETAILED DESCRIPTION OF THE PREFERRED EMBODIMENTS

Figure 1:
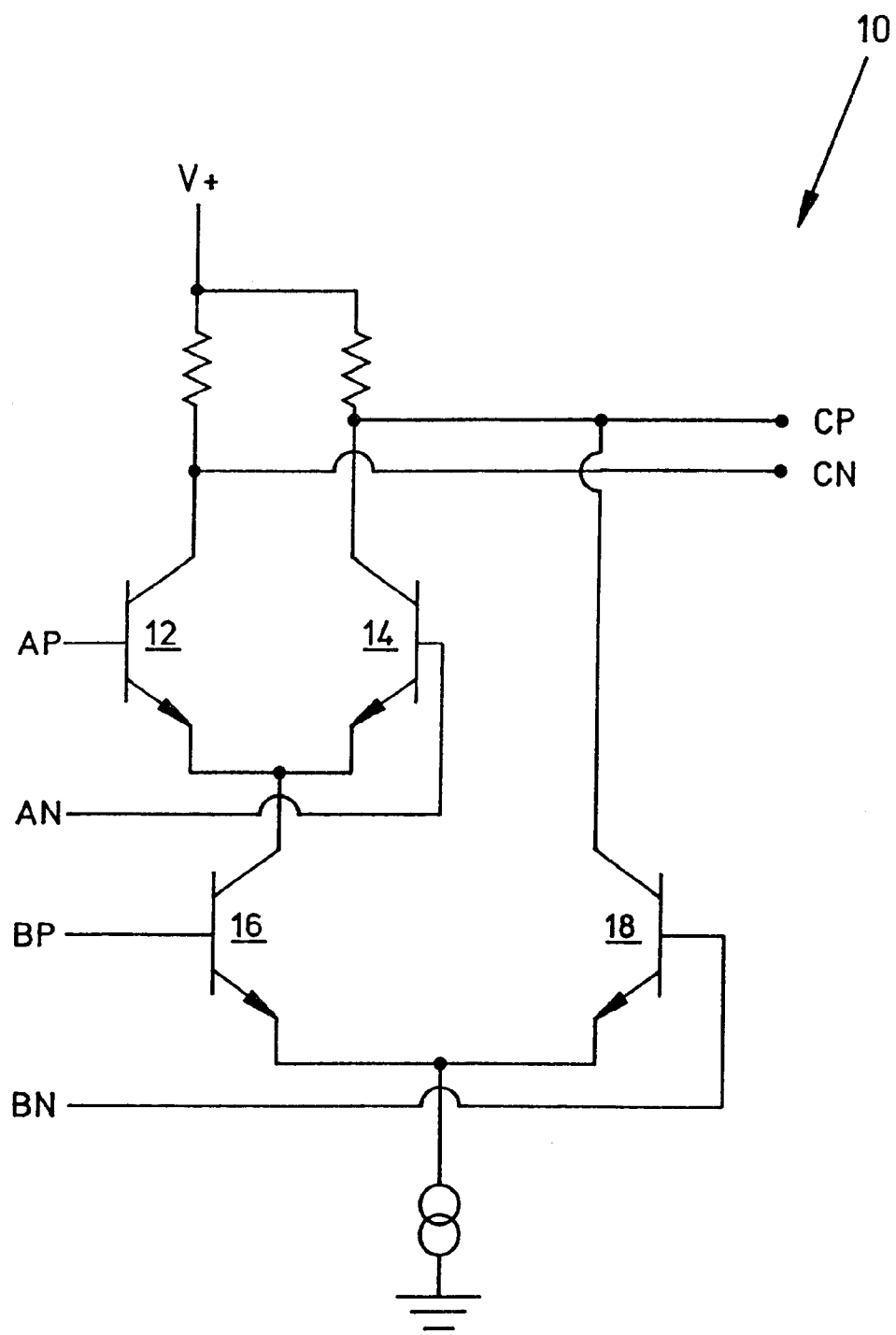
FIG. 1 is a schematic diagram of a conventional differential signal AND circuit (prior art).
Figure 2:
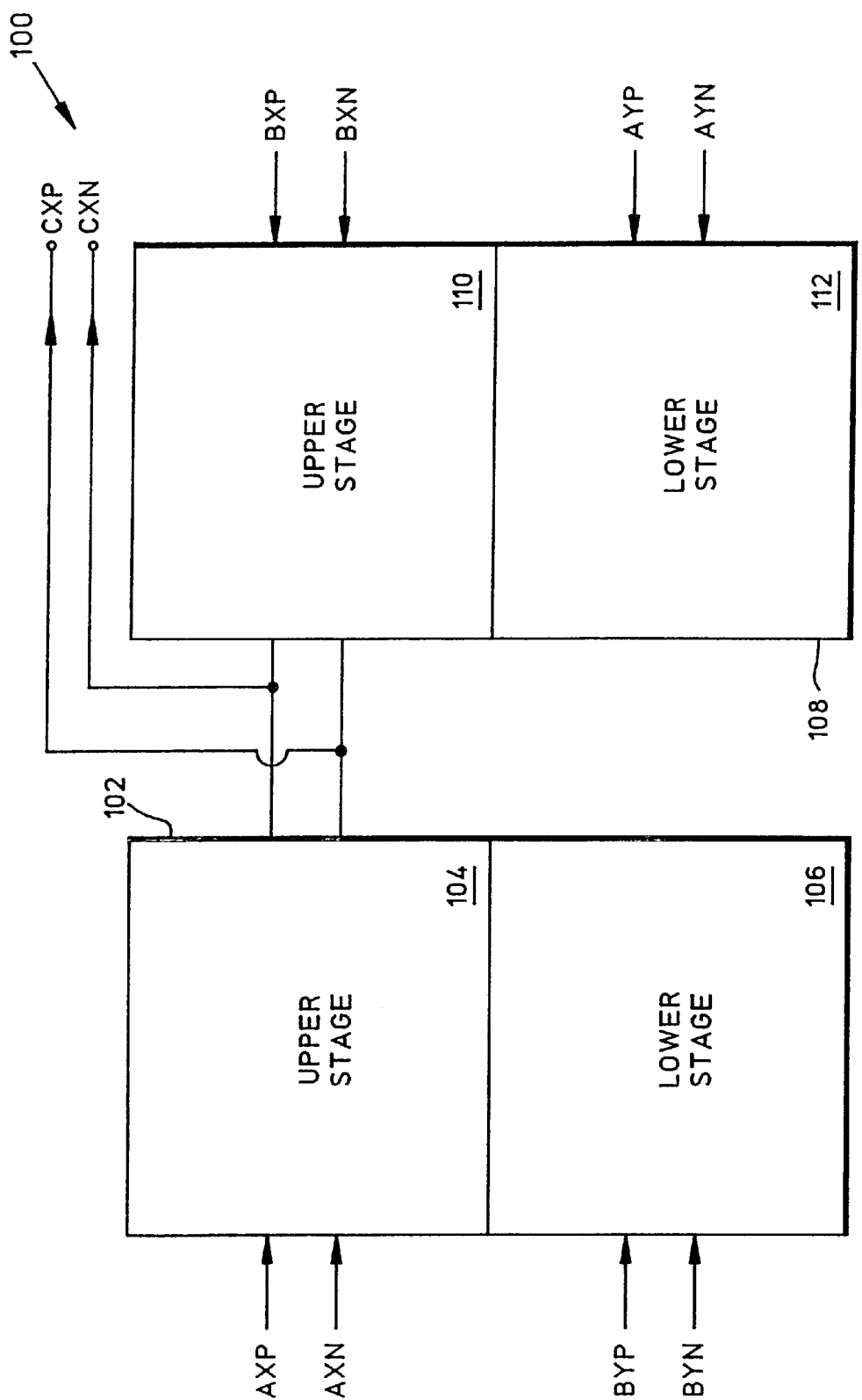
FIG. 2 is a schematic block diagram of the present invention integrated circuit CML circuit for supplying a differential output signal with equal delays.

FIG. 2 is a schematic block diagram of the present invention integrated circuit CML circuit for supplying a differential output signal with equal delays. The circuit 100 comprises a first differential cascode section 102 having an upper transistor stage 104 to accept a first differential input signal AXP and AXN. The "A" identifies the signal as the first signal, the "X" identifies the signal as having no voltage offset, and the "N" and "P" identify the first and second polarity, respectively, of the differential signal. A lower transistor stage 106 accepts an offset second differential input BYN and BYP, where B identifies the signal as the second signal and the "Y" identifies the signal as having a voltage offset one diode drop lower than an "X" signal.

A second differential cascode section 108 has an upper transistor stage 110 to accept a second differential input signal BXN and BXP and a lower transistor stage 112 to accept an offset first differential input signal AYN and AYP.

The first and second cascode sections are connected to supply a differential output signal CXN and CXP having equal delays in response to the first differential input signal (AXN, AXP), the second differential input signal (BXN, BXP), the first offset differential input signal (AYN, AYP), and the second offset differential signal (BYN, BYP).

Figure 3:
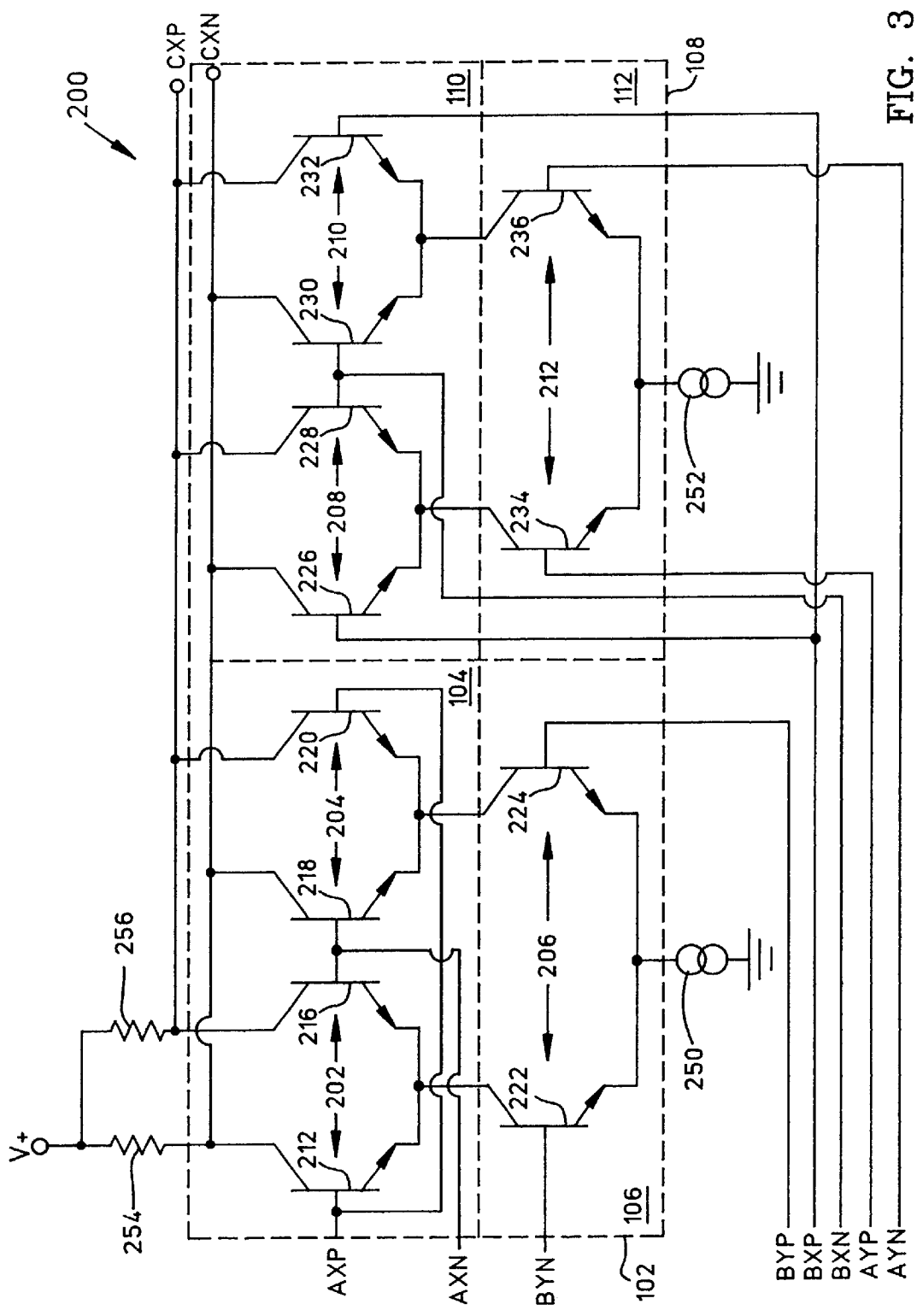
FIG. 3 is a schematic diagram of the present invention equal delay CML circuit of FIG. 2, configured as an exclusive OR (XOR) circuit.

FIG. 3 is a schematic diagram of the present invention equal delay CML circuit of FIG. 2, configured as an exclusive OR (XOR) circuit 200. The first cascode section 102 includes a first transistor pair 202 having commonly connected emitters, and bases connected to accept the first differential input signal (AX). A second transistor pair 204 has commonly connected emitters, and bases connected to receive the first differential input signal. A third transistor pair 206 has commonly connected emitters and collectors connected to the emitters of the first transistor pair 202 and the second transistors pair 204. The bases of the third transistor pair 206 accept the offset second differential input signal (BY).

The second cascode section includes a fourth transistor pair 208 having commonly connected emitters and bases connected to accept the second differential input signal (BX). A fifth transistor pair 210 has commonly connected emitters and bases connected to receive the second differential input signal. A sixth transistor pair 212 has commonly connected emitters and collectors connected to the emitters of the fourth transistor pair 208 and the fifth transistors pair 210. The bases of the sixth transistor pair 212 accept the offset first differential input signal (AY).

Figure 4:
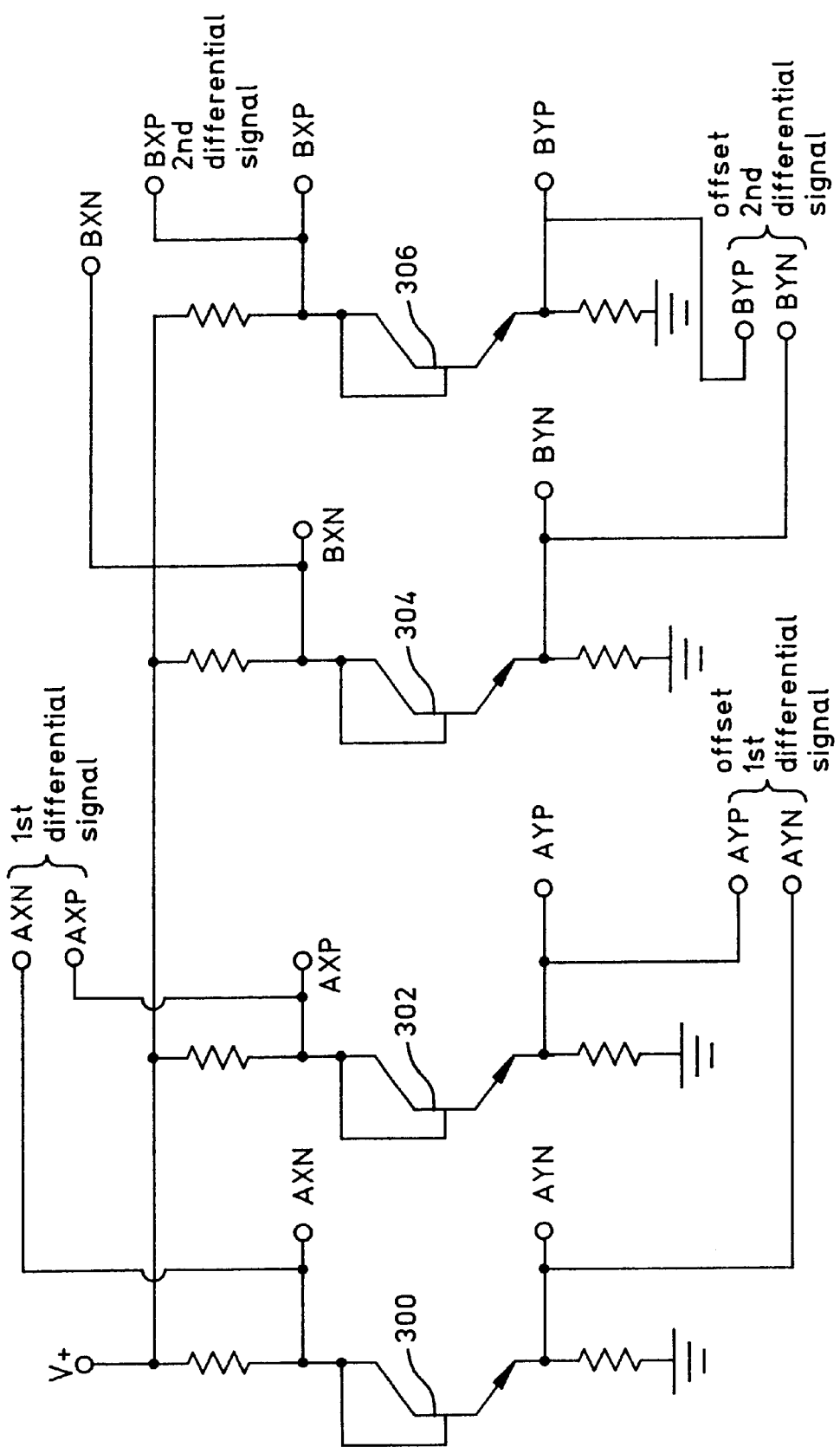
FIG. 4 is a schematic diagram illustrating the relationship between the differential signals and their corresponding offset differential signals.

FIG. 4 is a schematic diagram illustrating the relationship between the differential signals and their corresponding offset differential signals. As shown, a transistor 300, with the collector tied to the base, creates a one diode drop voltage offset between the AXN and AYN signals. Transistor 300 is effectively a first diode having a anode to accept the first polarity of the first differential input signal (AXN) and a cathode to supply the first polarity of the offset first differential input signal (AYN). Likewise, transistor 302 creates a one diode voltage drop between the AXP and AYP signals. Transistor 302 is effectively a second diode having a anode to accept the second polarity of the first differential input signal (AXP) and a cathode to supply the second polarity of the offset first differential input signal (AYP). Although not shown, the AXN and AXP signals may be the differential output signal of a pervious circuit or logic operation.

In the same manner, transistor 304 creates a one diode offset between the BXN and the BYN signals. Transistor 304 is effectively a third diode having a anode to accept the first polarity of the second differential input signal (BXN) and a cathode to supply the first polarity of the offset second differential input signal (BYN). Transistor 306 creates a one diode offset between the BXP and BYP signals. Transistor 306 acts as a fourth diode having a anode to accept the second polarity of the second differential input signal (BXP) and a cathode to supply the second polarity of the offset second differential input signal (BYP). Although NPN transistors are shown equivalent results could be obtained using PNP transistors or diodes.

Returning the FIG. 3, the first transistor pair 202 includes a first transistor 214 and a second transistor 216. The second transistor pair 204 includes a third transistor 218 and a fourth transistor 220. The third transistor pair 206 includes a fifth transistor 222 and a sixth transistor 224. The emitters of the first transistor 214 and the second transistor 216 are connected to the collector of the fifth transistor 222. The emitters of the third transistor 218 and the fourth transistor 220 are connected to the collector of the sixth transistor 224.

The fourth transistor pair 208 includes a seventh transistor 226 and an eighth transistor 228. The fifth transistor pair 210 includes a ninth transistor 230 and a tenth transistor 232. The sixth transistor pair 212 includes an eleventh transistor 234 and a twelfth transistor 236. The emitters of the seventh transistor 226 and eighth transistor 228 are connected to the collector of the eleventh transistor 234, and the emitters of the ninth transistor 230 and the tenth transistor 232 are connected to the collector of the twelfth transistor 236.

The collectors of the first transistor 214, the third transistor 218, the seventh transistor 226, and the ninth transistor 230 are connected to supply the first polarity of the differential output signal (CXN). The collectors of the second transistor 216, the fourth transistor 220, the eighth transistor 228, and the tenth transistor 232 are connected to supply the second polarity of the output differential signal (CXP).

As shown, the first polarity of the first differential input signal (AXN) is supplied to the bases of the second and third transistors 216/218. The second polarity of the first differential input signal (AXP) is supplied to the bases of the first and fourth transistors 214/220. The second polarity of the second differential input signal (BXP) is supplied to the bases of the seventh and tenth transistors 226/232, and the first polarity of the second differential input signal (BXN) is supplied to the bases of the eighth and ninth transistors 228/230.

The first polarity of the offset second differential input signal (BYN) is supplied to the base of the fifth transistor 222 and the second polarity of the offset second differential input signal (BYP) is supplied to the base of the sixth transistor 224.

The second polarity of the offset first differential input signal AYP is supplied to the base of the eleventh transistor 234 and the first polarity of the offset first differential input signal AYN is supplied to the base of the twelfth transistor 236.

A first voltage source (V+) and a second voltage source (ground) are provided in FIG. 3. The emitters of the fifth transistor 222, sixth transistor 224, eleventh transistor 234, and twelfth transistor 236 are coupled to the second voltage source. Specifically, a first current source 250 is connected between the emitters of the fifth transistor 222 and the sixth transistor 224 and the second voltage source. A second current source 252 is connected between the emitters of the eleventh transistor 234 and the twelfth transistor 236 and the second voltage source.

The collectors of first transistor 214, second transistor 216, third transistor 218, fourth transistor 220, seventh transistor 226, eight transistor 228, ninth transistor 230, and tenth transistor 232 are coupled to the first voltage source. Specifically, a first resistor 254 is connected between the first voltage source and the collectors of the first transistor 214, third transistor 218, seventh transistor 226, and the ninth transistor 230. A second resistor 256 is connected between the first voltage source and the collectors of the second transistor 216, fourth transistor 220, eighth transistor 228, and the tenth transistor 232.

As can be appreciated from studying the circuit, both the first (A) differential signal and the second (B) differential signal are supplied to an upper stage, so that changes in logic state are translated to the output differential signal (C) with only a one transistor delay. The offset differential signal AY and BY are provided to the lower stages to support the operation of the upper stages.

Figure 5:
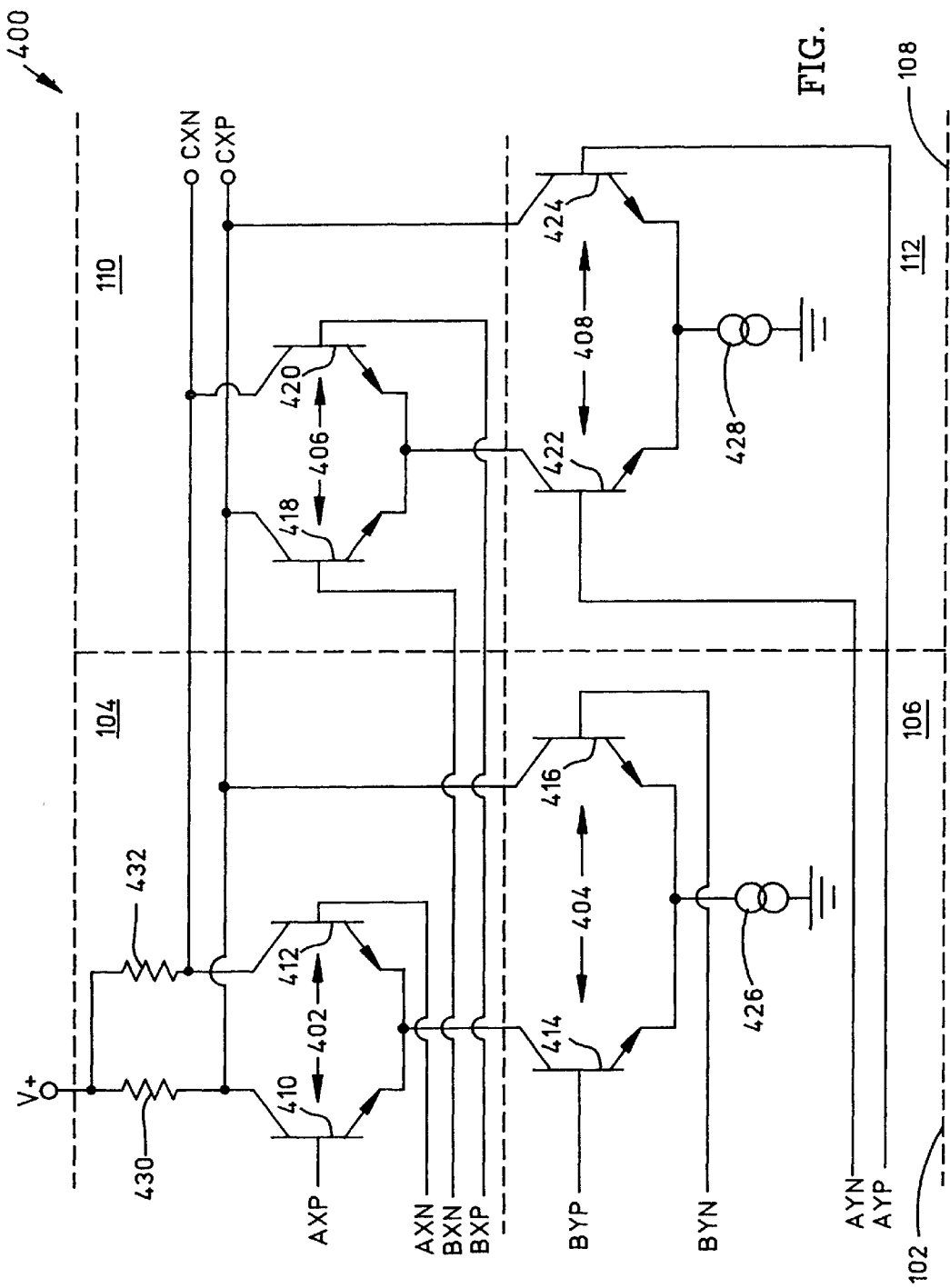
FIG. 5 is a schematic diagram of the present invention equal delay CML circuit of FIG. 2, configured as an AND circuit.

FIG. 5 is a schematic diagram of the present invention equal delay CML circuit of FIG. 2, configured as an AND circuit 400. The upper stage 104 of the first cascode section 102 includes a first transistor pair 402 having commonly connected emitters, and bases connected to accept the first differential input signal (AX). The lower stage 106 includes a second transistor pair 404 having commonly connected emitters, and bases to accept the offset second differential input signal (BY). The upper stage 110 of the second cascode section 108 includes a third transistor pair 406 having commonly connected emitters, and bases connected to accept the second differential input signal (BX). A fourth transistor pair 408 has commonly connected emitters, and bases to accept the offset first differential input signal (AY).

The first transistor pair 402 includes a first transistor 410 and a second transistor 412. The second transistor pair includes a third transistor 414 and a fourth transistor 416. The emitters of the first and second transistors 410/412 are connected to the collector of the third transistor 414. The collector of the fourth transistor 416 is connected to the collector of the second transistor 412. The third transistor pair 406 includes a fifth transistor 418 and a sixth transistor 420. The fourth transistor pair 408 includes a seventh transistor 422 and an eighth transistor 424. The emitters of the fifth and sixth transistors 418/420 are connected to the collector of the seventh transistor 422. The collector of the eighth transistor 424 is connected to the collector of the second transistor 412.

The collectors of the first and sixth transistors 410/420 are connected to supply the first polarity of the differential output signal (CXN). The collectors of the second and fifth transistors 412/418 are connected to supply the second polarity of the output differential signal (CXP).

The second polarity of the first differential input signal (AXP) is supplied to the base of the first transistor 410, and the first polarity of the first differential input signal (AXN) is supplied to the base of the second transistor 412. The second polarity of the second differential input signal (BXP) is supplied to the base of the sixth transistor 420, and the first polarity of the second differential input signal (BXN) is supplied to the base of the fifth transistor 418.

The first polarity of the offset second differential input signal (BYN) is supplied to the base of the fourth transistor 416 and the second polarity of the offset second differential input signal (BYP) is supplied to the base of third transistor 414. The second polarity of the offset first differential input signal (AYP) is supplied to the base of the eighth transistor 424 and the first polarity of the offset first differential input signal (AYN) is supplied to the base of the seventh transistor 422.

A first voltage source (V+) and a second voltage source (ground) are provided. The emitters of the third transistor 414, fourth transistor 416, seventh transistor 422, and eighth transistor 424 are coupled to the second voltage source. A first current source 426 is connected between the emitters of the third and fourth transistors 414/416 and the second voltage source. A second current source 428 is connected between the emitters of the seventh and eighth transistors 422/424 and the second voltage source.

The collectors of first transistor 410, second transistor 412, fifth transistor 418, and sixth transistor 420 are coupled to the first voltage source. The collectors of the fourth 416 and eighth 424 transistors are also connected to the first voltage source. A first resistor 430 is connected between the first voltage source and the collectors of the first and sixth transistors 410/420. A second resistor 432 is connected between the first voltage source and the collectors of the second and fifth transistors 412/418, as well as to the collectors of the fourth 416 and eighth 424 transistors.

Figure 6:
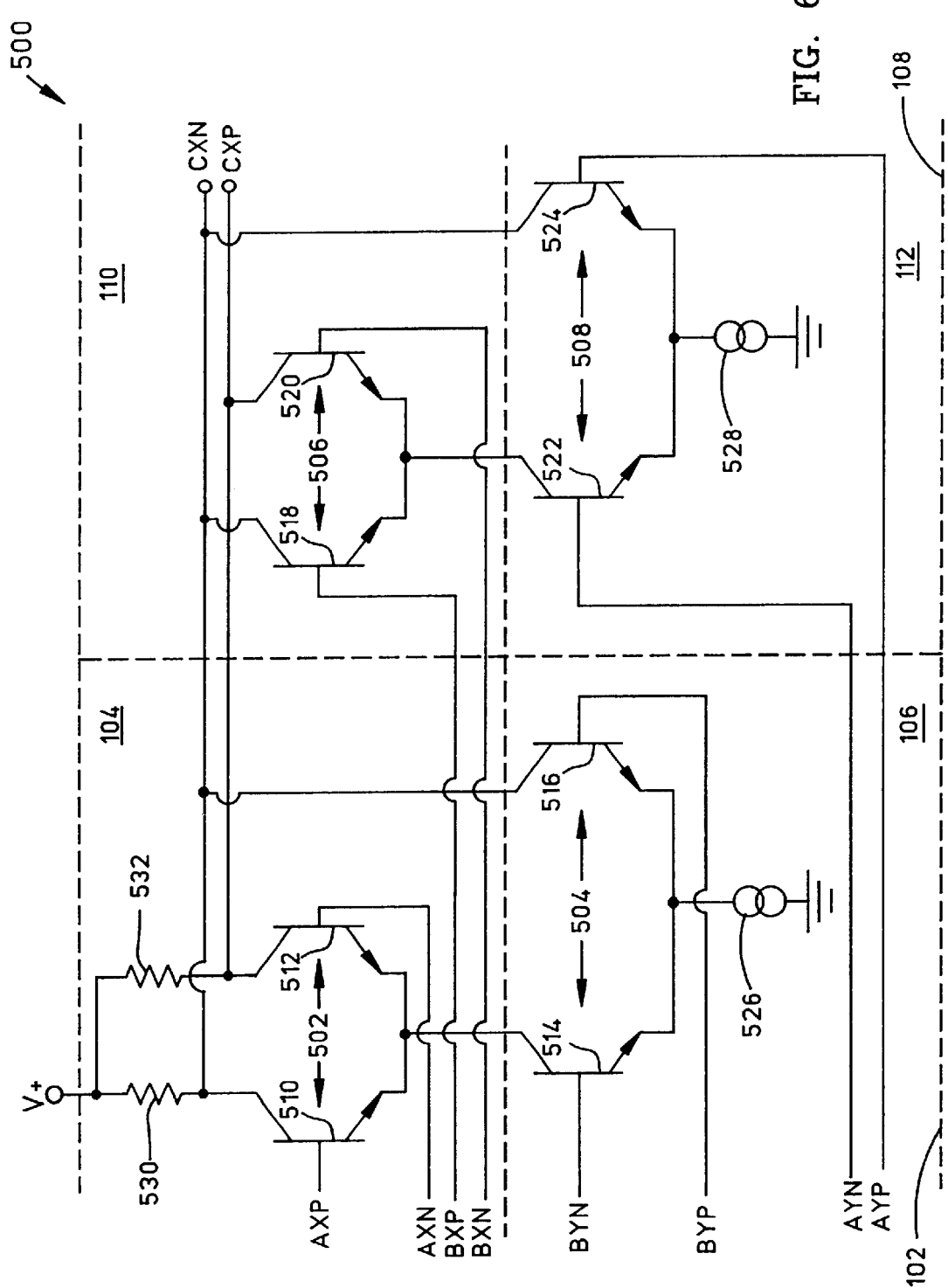
FIG. 6 is a schematic diagram of the present invention equal delay CML circuit of FIG. 2, configured as an OR circuit.

FIG. 6 is a schematic diagram of the present invention equal delay CML circuit of FIG. 2, configured as an OR circuit. The upper stage 104 of the first cascode section 102 includes a first transistor pair 502 having commonly connected emitters, and bases connected to accept the first differential input signal (AX). The lower stage 106 includes a second transistor pair 504 having commonly connected emitters, and bases to accept the offset second differential input signal (BY). The upper stage 110 of the second cascode section 108 includes a third transistor pair 506 having commonly connected emitters, and bases connected to accept the second differential input signal (BX). The lower stage 112 includes a fourth transistor pair 508 having commonly connected emitters, and bases to accept the offset first differential input signal (AY).

The first transistor pair 502 includes a first transistor 510 and a second transistor 512. The second transistor pair 504 includes a third transistor 514 and a fourth transistor 516. The emitters of the first and second transistor 510/512 are connected to the collector of the third transistor 514. The collector of the fourth transistor 516 is connected to the collector of the first transistor 510. The third transistor pair 506 includes a fifth transistor 518 and a sixth transistor 520. The fourth transistor pair 508 includes a seventh transistor 522 and an eighth transistor 524. The emitters of the fifth and sixth transistors 518/520 are connected to the collector of the seventh transistor 522. The collector of the eighth transistor 524 is connected to the collector of the fifth transistor 518.

The collectors of the first and fifth transistors 510/518, as well fourth and eighth transistors 516/524, are connected to supply the first polarity of the differential output signal (CXN). The collectors of the second and sixth transistors 512/520 are connected to supply the second polarity of the output differential signal (CXP).

The second polarity of the first differential input signal (AXP) is supplied to the base of the first transistor 510, and the first polarity of the first differential input signal (AXN) is supplied to the base of the second transistor 512. The first polarity of the second differential input signal (BXN) is supplied to the base of the sixth transistor 520, and the second polarity of the second differential input signal (BXP) is supplied to the base of the fifth transistor 518. The first polarity of the offset second differential input signal (BYN) is supplied to the base of the third transistor 514 and the second polarity of the offset second differential input signal (BYP) is supplied to the base of fourth transistor 516. The first polarity of the offset first differential input signal (AYN) is supplied to the base of the seventh transistor 522 and the second polarity of the offset first differential input signal (AYP) is supplied to the base of the eighth transistor 524.

A first voltage source (V+) and a second voltage source (ground) are provided. The emitters of the third transistor 514, fourth transistor 516, seventh transistor 522, and eighth transistor 524 are coupled to the second voltage source. A first current source 526 is connected between the emitters of the third and fourth transistors 514/516 and the second voltage source. A second current source 528 is connected between the emitters of the seventh and eighth transistors 522/524 and the second voltage source.

The collectors of first transistor 510, second transistor 512, fifth transistor 518, sixth transistor 520, fourth transistor 516, and eighth transistor 524 are coupled to the first voltage source. A first resistor 530 is connected between the first voltage source and the collectors of the first and fifth transistors 510/518, as well as the fourth and eighth transistors 516/524. A second resistor 532 is connected between the first voltage source and the collectors of the second and sixth transistors 512/520.

Figure 7:
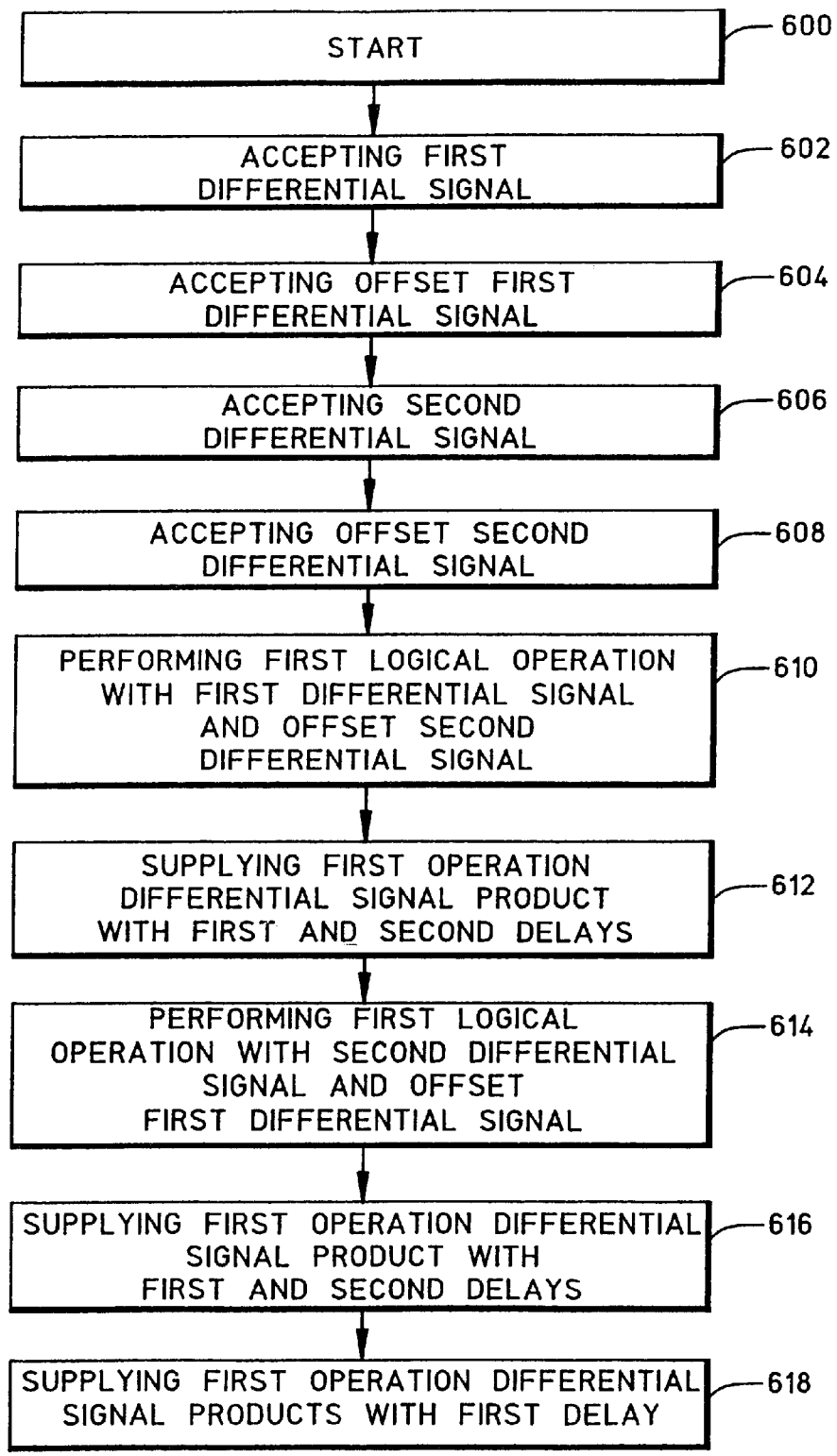
FIG. 7 is a flowchart illustrating a method for supplying a differential output signal with equal delays in an integrated circuit current-mode logic circuit.

FIG. 7 is a flowchart illustrating a method for supplying a differential output signal with equal delays in an integrated circuit current-mode logic circuit. Although the method is depicted as a sequence of number steps for clarity, no order should be inferred from the numbering unless explicitly stated. The method begins a Step 600. Step 602 accepts a first differential signal. Step 604 accepts an offset first differential signal with a voltage level offset from the first differential signal. Step 606 accepts a second differential signal. Step 608 accepts an offset second differential signal with a voltage level offset from the second differential signal. Step 610 performs a first logical operation using the first differential signal and the offset second differential signal. Step 612 supplies a first operation differential signal product having a first delay associated with the first differential signal and a second delay, greater than the first delay, associated with the offset second differential signal. Step 614 performs the first logical operation using the second differential signal and the offset first differential signal. Step 616 supplies a first operation differential signal product having a first delay associated with the second differential signal and a second delay, greater than the first delay, associated with the offset first differential signal. Step 618 combines the supplied first operation differential signal products to supply a combined first operation differential signal product having a first delay.

In some aspects of the invention, performing a first logical operation using the first differential signal and the offset second differential signal in Step 610 includes performing an exclusive OR (XOR) logical operation. Performing the first logical operation with the second differential signal and the offset first differential signal in Step 614 includes performing an exclusive OR logical operation. Then, combining the supplied first operation differential signal products to supply a combined first operation differential signal product having a first delay in Step 618 includes supplying an exclusive OR differential signal product having a first delay.

In some aspects of the invention, performing a first logical operation using the first differential signal and the offset second differential signal in Step 610 includes performing an AND logical operation. Performing the first logical operation with the second differential signal and the offset first differential signal in Step 614 includes performing an AND logical operation. Then, combining the supplied first operation differential signal products to supply a combined first operation differential signal product having a first delay in Step 618 includes supplying an AND differential signal product having a first delay.

In some aspects of the invention, performing a first logical operation using the first differential signal and the offset second differential signal in Step 610 includes performing an OR logical operation. Performing the first logical operation with the second differential signal and the offset first differential signal in Step 614 includes performing an OR logical operation. Then, combining the supplied first operation differential signal products to supply a combined first operation differential signal product having a first delay in Step 618 includes supplying an OR differential signal product having a first delay.

A system and method for equalizing delay in CML differential mode circuitry has been provided. Specific examples have been provided for XOR, OR, and AND logic operations. However, the principles of the invention are applicable to any kind of logic. The examples also show the use of NPN transistors. Equivalent circuits can be made using PNP transistors, or combinations of PNP and NPN transistors. The principles of the invention would also apply to logic circuits using FETs and CMOS technology, or combinations of bipolar transistors and FETs. Other variations and embodiments of the invention will occur to those skilled in the art.

I claim:

1. In an integrated circuit, a current-mode logic (CML) circuit for supplying a differential output signal with equal delays, the circuit comprising:

a first differential cascode section having an upper transistor stage to accept a first differential input signal and a lower transistor stage to accept an offset second differential input signal;

a second differential cascode section having an upper transistor stage to accept a second differential input signal and a lower transistor stage to accept an offset first differential input signal; and a first diode having an anode to accept the first polarity of the first differential input signal and a cathode to supply the first polarity of the offset first differential input signal;

a second diode having an anode to accept the second polarity of the first differential input signal and a cathode to supply the second polarity of the offset first differential input signal;

a third diode having an anode to accept the first polarity of the second differential input signal and a cathode to supply the first polarity of the offset second differential input signal; and a fourth diode having an anode to accept the second polarity of the second differential input signal and a cathode to supply the second polarity of the offset second differential input signal;

wherein the first and second cascode sections are connected to supply a differential output signal having equal delays in response to the first differential input signal, the second differential input signal, the first offset differential input signal, and the second offset differential signal.

2. The circuit of claim 1 in which the current-mode logic circuit is an exclusive OR (XOR) circuit;

wherein the first cascode section includes a first transistor pair having commonly connected emitters and bases connected to accept the first differential input signal, a second transistor pair having commonly connected emitters and bases connected to receive the first differential input signal, and a third transistor pair having commonly connected emitters, collectors connected to the emitters of the first and second transistors pairs, and bases to accept the offset second differential input signal; and wherein the second cascode section includes a fourth transistor pair having commonly connected emitters and bases connected to accept the second differential input signal, a fifth transistor pair having commonly connected emitters and bases connected to receive the second differential input signal, and a sixth transistor pair having commonly connected emitters, collectors connected to the emitters of the fourth and fifth transistors pairs, and bases to accept the offset first differential input signal.

3. The circuit of claim 2 wherein the first transistor pair includes a first and second transistors, the second transistor pair includes a third and fourth transistors, and the third transistor pair includes a fifth and sixth transistor, and wherein the emitters of the first and second transistor are connected to the collector of the fifth transistor and the emitters of the third and fourth transistors are connected to the collector of the sixth transistor; and wherein the fourth transistor pair includes a seventh and eighth transistor, the fifth transistor pair includes a ninth and tenth transistor, and the sixth transistor pair includes an eleventh and twelfth transistor, and wherein the emitters of the seventh and eighth transistor are connected to the collector of the eleventh transistor and the emitters of the ninth and tenth transistors are connected to the collector of the twelfth transistor.

4. The circuit of claim 3 wherein the collectors of the first, third, seventh, and ninth transistors are connected to supply the first polarity of the differential output signal; and wherein the collectors of the second, fourth, eighth, and tenth transistors are connected to supply the second polarity of the output differential signal.

5. The circuit of claim 4 wherein a second polarity of the first differential input signal is supplied to the bases of the first and fourth transistors, and the first polarity of the first differential input signal is supplied to the bases of the second and third transistors;

wherein a second polarity of the second differential input signal is supplied to the bases of the seventh and tenth transistors, and the first polarity of the second differential input signal is supplied to the bases of the eighth and ninth transistors;

wherein the first polarity of the offset second differential input signal is supplied to the base of the fifth transistor and the second polarity of the offset second differential input signal is supplied to the base of the sixth transistor; and wherein the second polarity of the offset first differential input signal is supplied to the base of the eleventh transistor and the first polarity of the offset first differential input signal is supplied to the base of the twelfth transistor.

6. The circuit of claim 5 in which a first voltage source and a second voltage source are provided;

wherein the emitters of the fifth, sixth, eleventh, and twelfth transistors are coupled to the second voltage source; and wherein the collectors of first, second, third, fourth, seventh, eight, ninth, and tenth transistors are coupled to the first voltage source.

7. The circuit of claim 6 further comprising:

a first current source connected between the emitters of the fifth and sixth transistors and the second voltage source;

a second current source connected between the emitters of the eleventh and twelfth transistors and the second voltage source;

a first resistor connected between the first voltage source and the collectors of the first, third, seventh, and ninth transistors; and a second resistor connected between the first voltage source and the collectors of the second, fourth, eighth, and tenth transistors.

8. The circuit of claim 1 in which the current-mode logic circuit is an AND circuit;

wherein the first cascode section includes a first transistor pair having commonly connected emitters and bases connected to accept the first differential input signal and a second transistor pair having commonly connected emitters and bases to accept the offset second differential input signal; and wherein the second cascode section includes a third transistor pair having commonly connected emitters and bases connected to accept the second differential input signal and a fourth transistor pair having commonly connected emitters and bases to accept the offset first differential input signal.

9. The circuit of claim 8 wherein the first transistor pair includes a first and second transistor and the second transistor pair includes a third and fourth transistor, and wherein the emitters of the first and second transistor are connected to the collector of the third transistor and the collector of the fourth transistor is connected to the collector of the second transistor; and wherein the third transistor pair includes a fifth and sixth transistor and the fourth transistor pair includes a seventh and eighth transistor, and wherein the emitters of the fifth and sixth transistors are connected to the collector of the seventh transistor and the collector of the eighth transistor is connected to the collector of the second transistor.

10. The circuit of claim 9 wherein the collectors of the first and sixth transistors are connected to supply the first polarity of the differential output signal; and wherein the collectors of the second and fifth transistors are connected to supply the second polarity of the output differential signal.

11. The circuit of claim 10 wherein the second polarity of the first differential input signal is supplied to the base of the first transistor, and the first polarity of the first differential input signal is supplied to the base of the second transistor;

wherein a second polarity of the second differential input signal is supplied to the base of the sixth transistor, and the first polarity of the second differential input signal is supplied to the base of the fifth transistor;

wherein the first polarity of the offset second differential input signal is supplied to the base of the fourth transistor and the second polarity of the offset second differential input signal is supplied to the base of third transistor; and wherein the second polarity of the offset first differential input signal is supplied to the base of the eighth transistor and the first polarity of the offset first differential input signal is supplied to the base of the seventh transistor.

12. The circuit of claim 11 in which a first voltage source and a second voltage source are provided;

wherein the emitters of the third, fourth, seventh, and eighth transistors are coupled to the second voltage source; and wherein the collectors of first, second, fifth, and sixth transistors are coupled to the first voltage source.

13. The circuit of claim 12 further comprising:

a first current source connected between the emitters of the third and fourth transistors and the second voltage source;

a second current source connected between the emitters of the seventh and eighth transistors and the second voltage source;

a first resistor connected between the first voltage source and the collectors of the first and sixth transistors; and a second resistor connected between the first voltage source and the collectors of the second and fifth transistors.

14. The circuit of claim 1 in which the current-mode logic circuit is an OR circuit;
   wherein the first cascode section includes a first transistor pair having commonly connected emitters and bases connected to accept the first differential input signal and a second transistor pair having commonly connected emitters, and bases to accept the offset second differential input signal; and
   wherein the second cascode section includes a third transistor pair having commonly connected emitters and bases connected to accept the second differential input signal and a fourth transistor pair having commonly connected emitters and bases to accept the offset first differential input signal.

15. The circuit of claim 14 wherein the first transistor pair includes a first and second transistor and the second transistor pair includes a third and fourth transistor, and wherein the emitters of the first and second transistor are connected to the collector of the third transistor and the collector of the fourth transistor is connected to the collector of the first transistor; and
   wherein the third transistor pair includes a fifth and sixth transistor and the fourth transistor pair includes a seventh and eighth transistor, and wherein the emitters of the fifth and sixth transistors are connected to the collector of the seventh transistor and the collector of the eighth transistor is connected to the collector of the fifth transistor.

16. The circuit of claim 15 wherein the collectors of the first and fifth transistors are connected to supply the first polarity of the differential output signal; and
   wherein the collectors of the second and sixth transistors are connected to supply the second polarity of the output differential signal.

17. The circuit of claim 16 wherein the second polarity of the first differential input signal is supplied to the base of the first transistor, and the first polarity of the first differential input signal is supplied to the base of the second transistor;
   wherein a first polarity of the second differential input signal is supplied to the base of the sixth transistor, and the second polarity of the second differential input signal is supplied to the base of the fifth transistor;
   wherein the first polarity of the offset second differential input signal is supplied to the base of the third transistor and the second polarity of the offset second differential input signal is supplied to the base of fourth transistor; and
   wherein the first polarity of the offset first differential input signal is supplied to the base of the seventh transistor and the second polarity of the offset first differential input signal is supplied to the base of the eighth transistor.

18. The circuit of claim 17 in which a first voltage source and a second voltage source are provided;
   wherein the emitters of the third, fourth, seventh, and eighth transistors are coupled to the second voltage source; and
   wherein the collectors of first, second, fifth, and sixth transistors are coupled to the first voltage source.

19. The circuit of claim 18 further comprising:
   a first current source connected between the emitters of the third and fourth transistors and the second voltage source;
   a second current source connected between the emitters of the seventh and eighth transistors and the second voltage source;
   a first resistor connected between the first voltage source and the collectors of the first and fifth transistors; and
   a second resistor connected between the first voltage source and the collectors of the second and sixth transistors.

20. In an integrated circuit current-mode logic circuit, a method for supplying a differential output signal with equal delays, the method comprising:
   accepting a first differential signal, wherein a first polarity of the first differential signal is accepted at an anode of a first diode, and a second polarity of the first differential signal is accepted at a anode of a second diode;
   accepting an offset first differential signal with a voltage level offset from the first differential signal, wherein a first polarity of the offset first differential signal is supplied by a cathode of the first diode, and a second polarity of the offset first differential signal is supplied by a cathode of the second diode;
   accepting a second differential signal, wherein a first polarity of the second differential signal is accepted at an anode of a third diode, and a second polarity of the second differential signal is accepted at an anode of a fourth diode,
   accepting an offset second differential signal with a voltage level offset from the second differential signal, wherein a first polarity of the offset second differential signal is supplied by a cathode of the third diode, and a second polarity of the offset second differently signal is supplied by a cathode of the fourth diode;
   performing a first logical operation using the first differential signal and the offset second differential signal;
   supplying a first operation differential signal product having a first delay associated with the first differential signal and a second delay, greater than the first delay, associated with the offset second differential signal;
   performing the first logical operation using the second differential signal and the offset first differential signal;
   supplying a first operation differential signal product having a first delay associated with the second differential signal and a second delay, greater than the first delay, associated with the offset first differential signal; and
   combining the supplied first operation differential signal products to supply a combined first operation differential signal product having a first delay.

21. The method of claim 20 wherein performing a first logical operation using the first differential signal and the offset second differential signal includes performing an exclusive OR (XOR) logical operation;
   wherein performing the first logical operation with the second differential signal and the offset first differential signal includes performing an exclusive OR logical operation; and
   wherein combining the supplied first operation differential signal products to supply a combined first operation differential signal product having a first delay includes supplying an exclusive OR differential signal product having a first delay.

22. The method of claim 20 wherein performing a first logical operation using the first differential signal and the offset second differential signal includes performing an AND logical operation;

wherein performing the first logical operation with the second differential signal and the offset first differential signal includes performing an AND logical operation; and wherein combining the supplied first operation differential signal products to supply a combined first operation differential signal product having a first delay includes supplying an AND differential signal product having a first delay.

23. The method of claim 20 wherein performing a first logical operation using the first differential signal and the offset second differential signal includes performing an OR logical operation;

wherein performing the first logical operation with the second differential signal and the offset first differential signal includes performing an OR logical operation; and wherein combining the supplied first operation differential signal products to supply a combined first operation differential signal product having a first delay includes supplying an OR differential signal product having a first delay.

* * * * *